US011025266B2

(12) United States Patent
Wang et al.

(10) Patent No.: US 11,025,266 B2
(45) Date of Patent: Jun. 1, 2021

(54) DIGITAL-TO-ANALOG CONVERTER, CONVERSION CIRCUIT AND DISPLAY DEVICE (71) Applicant: BOE TECHNOLOGY GROUP CO., LTD., Beijing (CN)

(72) Inventors: Tangxiang Wang, Beijing (CN); Chen Song, Beijing (CN); Zhan Gao, Beijing (CN); Yi Chen, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/489,150

(22) PCT Filed: Mar. 18, 2019

(86) PCT No.: PCT/CN2019/078476
§ 371 (c)(1),
(2) Date: Aug. 27, 2019

(87) PCT Pub. No.: WO2019/205833
PCT Pub. Date: Oct. 31, 2019

(65) Prior Publication Data
US 2021/0013899 A1    Jan. 14, 2021

(30) Foreign Application Priority Data
Apr. 24, 2018   (CN) .......................... 201810377104.2

(51) Int. Cl.
H03M 1/68     (2006.01)
G09G 3/20     (2006.01)
H03M 1/76     (2006.01)

(52) U.S. Cl.
CPC ................ *H03M 1/68* (2013.01); *G09G 3/20* (2013.01); *H03M 1/76* (2013.01); *G09G 2310/027* (2013.01)

(58) Field of Classification Search
CPC ........ H03M 1/468; H03M 1/145; H03M 1/42; H03M 1/466; H03M 1/12; H03M 1/164; H03M 1/76; G09G 2300/0828
See application file for complete search history.

(56) References Cited

U.S. PATENT DOCUMENTS

2007/0040719 A1*  2/2007  Kim ...................... H03M 1/682
                                                    341/144
2007/0152860 A1   7/2007  Jain
(Continued)

FOREIGN PATENT DOCUMENTS

CN    103414472 A    11/2013
CN    107809251 A     3/2018
CN    108540135 A     9/2018

OTHER PUBLICATIONS

First Office Action for CN Appl. No. 201810377104.2, dated Dec. 2, 2019.

*Primary Examiner* — Gerald Johnson
(74) *Attorney, Agent, or Firm* — The Webb Law Firm (57)  ABSTRACT Embodiments of the present disclosure provide a digital-to-analog converter, a conversion circuit and a display device. An M-bit digital-to-analog converter includes a higher M–N-bit digital-to-analog conversion circuit, a voltage conversion circuit, an output circuit. The higher M–N-bit digital-to-analog conversion circuit includes: a higher M–N-bit voltage division generation circuit, a first voltage selection circuit. The first voltage selection circuit selects a first voltage from the higher M–N-bit voltage division generation circuit based on a higher M–N-bit digital signal, to be output from a first voltage end. The voltage conversion circuit charges a capacitor circuit under the control of a first switch circuit and a second switch circuit, and discharges a second voltage to a second voltage end through the capacitor circuit. The output circuit controls the first voltage and the second (Continued)

voltage based on a lower N-bit digital signal, generates an analog voltage signal corresponding to an M-bit digital signal.

18 Claims, 6 Drawing Sheets

(56) References Cited

U.S. PATENT DOCUMENTS

| | | | |
|---|---|---|---|
| 2009/0051575 A1* | 2/2009 | Lee | H03M 1/682 341/136 |
| 2010/0176872 A1* | 7/2010 | Saikusa | H02J 7/0044 327/536 |
| 2019/0147789 A1* | 5/2019 | Morita | G09G 3/20 345/690 |

* cited by examiner

DIGITAL-TO-ANALOG CONVERTER, CONVERSION CIRCUIT AND DISPLAY DEVICE

CROSS-REFERENCE TO RELATED APPLICATIONS

This application is a U.S. National Stage under 35 U.S.C. § 371 of International Patent Application No. PCT/CN2019/078476, as filed on Mar. 18, 2019, which claims priority to Chinese Patent Application No. 2018/10377104.2 filed on Apr. 24, 2018, and entitled "Digital-to-analog Converter and Conversion Circuit". The disclosure of each of these applications is incorporated by reference herein for all purposes.

TECHNICAL FIELD

The present disclosure relates to a digital-to-analog converter, a conversion circuit and a display device.

BACKGROUND

A digital-to-analog converter, also referred to as a D/A converter, abbreviated as DAC, is a device which converts a digital signal into an analog signal. Wherein, a resistor series voltage division type DAC is a device which uses resistance voltage division to achieve conversion of the digital signal to the analog signal, and the resistor series voltage division type DAC is applied to various converter circuits because of its advantages of a simple structure, small burr, good linearity, etc. However, with respect to a high-bit resistor series voltage division type DAC, it is necessary to use a large number of resistors, for example, with respect to a 10-bit resistor series voltage division type DAC, generally it is necessary to adopt 1024 ($2^{10}$) resistors, 2048 ($2^{11}$) switches, so that this results in a complex structure of DAC, causes a chip (IC) to have a large design area, a high cost; therefore, optimizing the DAC circuit structure, reducing the number of switches, resistors, is a current big challenge.

SUMMARY

An embodiment of the present disclosure provides a digital-to-analog converter, the digital-to-analog converter is an M-bit digital-to-analog converter; the digital-to-analog converter includes: a higher M−N-bit digital-to-analog conversion circuit, a voltage conversion circuit, an output circuit; wherein, M, N are both positive integers, and M>N; the higher M−N-bit digital-to-analog conversion circuit includes: a higher M−N-bit voltage division generation circuit, a first voltage selection circuit; the first voltage selection circuit selects a first voltage from the higher M−N-bit voltage division generation circuit based on a higher M−N-bit digital signal in an M-bit digital signal, to be output from a first voltage end; the voltage conversion circuit includes a first switch circuit, a second switch circuit and a capacitor circuit; the first switch circuit is connected with the higher M−N-bit voltage division generation circuit and the capacitor circuit, the second switch circuit is connected with the capacitor circuit, the first voltage end, a second voltage end; the voltage conversion circuit is used to charge the capacitor circuit under the control of the first switch circuit and the second switch circuit, and discharge a second voltage to the second voltage end through the capacitor circuit under the control of the first switch circuit and the second switch circuit; wherein, a difference between the second voltage and the first voltage is equal to a step voltage in the higher M−N-bit voltage division generation circuit; the output circuit is connected with the first voltage end and the second voltage end, controls output of the first voltage of the first voltage end and the second voltage of the second voltage end based on a lower N-bit digital signal in the M-bit digital signal, generates and outputs an analog voltage signal corresponding to the M-bit digital signal.

In some embodiments, the higher M−N-bit voltage division generation circuit includes a series resistor element connected between a high potential voltage end and a low potential voltage end, the series resistor element includes $2^{M-N}$ resistors connected in series which have a same resistance value.

In some embodiments, the first switch circuit includes a first switch and a second switch; the capacitor circuit includes a first capacitor; a first end of the first capacitor is connected with a first node in the series resistor element through the first switch, a second end is connected with a second node in the series resistor element through the second switch; wherein, the first node and the second node are voltage nodes of two adjacent ends of any one resistor in the series resistor element, and a voltage of the second node is more than that of the first node; the second switch circuit includes a third switch and a fourth switch; the first end of the first capacitor is also connected with the first voltage end through the third switch, the second end of the first capacitor is also connected with the second voltage end through the fourth switch.

In some embodiments, the voltage conversion circuit further includes a second capacitor, a first end of the second capacitor being grounded, a second end being connected between the first node and the first switch; and/or the voltage conversion circuit further includes a third capacitor, a first end of the third capacitor being grounded, a second end being connected between the third switch and the first voltage end.

In some embodiments, the first node and the second node are voltage nodes of two ends of a $2^{N-1}$th or $2^{N-1}+1$th or $2^{N-1}-1$th resistor in the series resistor element in a direction from the low potential voltage end to the high potential voltage end.

In some embodiments, the output circuit includes: a buffer circuit which has N+1 positive phase input ends as well as N second voltage selection circuits; the N+1 input ends of the buffer circuit are {Vin1, Vin2 ... Vin(N+1)} respectively; all of the N second voltage selection circuits are connected with the first voltage end and the second voltage end, and the N second voltage selection circuits are connected with the N different positive phase input ends {Vin1, Vin2 ... VinN} of the buffer circuit respectively, are used to, according to the lower N-bit digital signal in the M-bit digital signal, select the first voltage of the first voltage end or the second voltage of the second voltage end to be output to corresponding positive phase input ends in the buffer circuit; a positive phase input end Vin(N+1) of the buffer circuit is connected with the first voltage end, a negative phase input end of the buffer circuit is connected with the output end; and values of width to length ratios of differential pair tubes of N+1 branches corresponding to positive phase input ends {Vin1, Vin2 ... Vin(N+1)} of the buffer circuit are $2^{N-1}:2^{N-2} \ldots 2^1:2^0:1$.

In some embodiments, the first voltage selection circuit is an M−N-bit binary switch tree.

In some embodiments, M=8, 9, 10, 11 or 12.

In some embodiments, N=2, 3 or 4.

Another aspect of an embodiment of the present disclosure also provides a conversion circuit which includes the aforementioned digital-to-analog converter.

An embodiment of the present disclosure provides a digital-to-analog converter and a conversion circuit, the M-bit digital-to-analog converter includes: a higher M−N-bit digital-to-analog conversion circuit, a voltage conversion circuit, an output circuit; wherein, M, N are both positive integers, and M>N; wherein the higher M−N-bit digital-to-analog conversion circuit includes: a higher M−N-bit voltage division generation circuit, a first voltage selection circuit; the first voltage selection circuit selects a first voltage from the higher M−N-bit voltage division generation circuit based on a higher M−N-bit digital signal in an M-bit digital signal, to be output from a first voltage end; the voltage conversion circuit includes a first switch circuit, a second switch circuit and a capacitor circuit; the first switch circuit is connected with the higher M−N-bit voltage division generation circuit and the capacitor circuit, the second switch circuit is connected with the capacitor circuit, the first voltage end, a second voltage end; the voltage conversion circuit is used to charge the capacitor circuit under the control of the first switch circuit and the second switch circuit, and discharge a second voltage to the second voltage end through the capacitor circuit under the control of the first switch circuit and the second switch circuit; wherein, a difference between the second voltage and the first voltage is equal to a step voltage in the higher M−N-bit voltage division generation circuit; the output circuit is connected with the first voltage end and the second voltage end, controls the first voltage of the first voltage end and the second voltage of the second voltage end based on a lower N-bit digital signal in the M-bit digital signal, generates and outputs an analog voltage signal corresponding to the M-bit digital signal.

BRIEF DESCRIPTION OF THE DRAWINGS

In order to explain embodiments of the present disclosure or technical solutions in the prior art more clearly, drawings which are needed to be used in the embodiments or the description of the prior art will be introduced briefly below. Obviously, the drawings in the following description are only some embodiments of the present disclosure. Those ordinary skilled in the art may further obtain other drawings according to these drawings, without creative labor.

DETAILED DESCRIPTION

Hereinafter, a clear and complete description of technical solutions in embodiments of the present disclosure will be given in conjunction with drawings in embodiments of the present disclosure. Obviously, described embodiments are only a part of embodiments of the present disclosure, but not all of them. Based on embodiments in the present disclosure, all other embodiments obtained by those skilled in the art without creative labor fall within the protection scope of the present disclosure.

An embodiment of the present invention is to simplify a circuit structure of a digital-to-analog converter, to solve a problem of a size of an IC of the digital-to-analog converter being too big.

Figure 1:
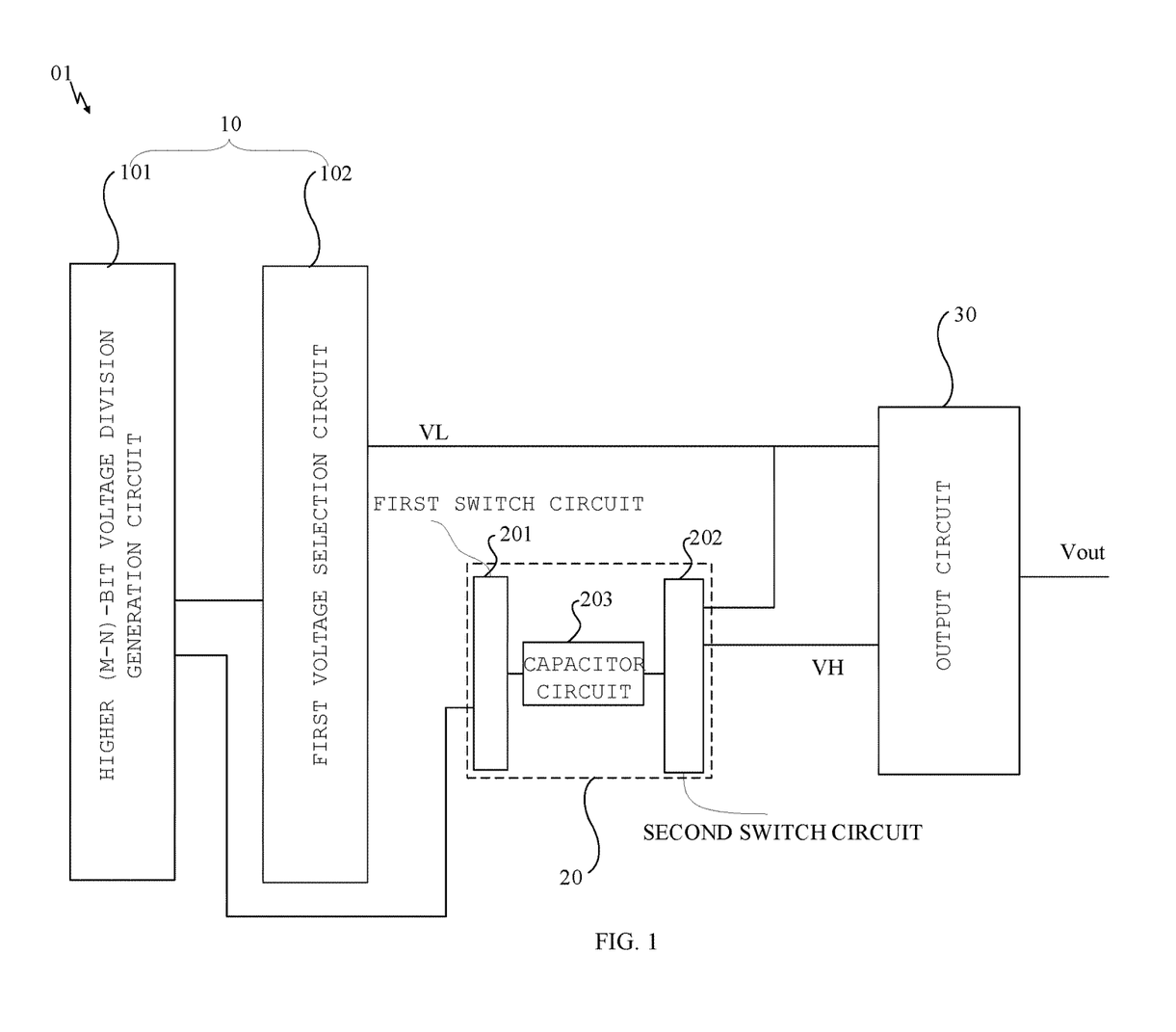
FIG. 1 is a schematic view of a structure of a digital-to-analog converter provided by an embodiment of the present disclosure.

FIG. 1 is a schematic view of a structure of a digital-to-analog converter 01 provided by an embodiment of the present disclosure. The digital-to-analog converter 01 is an M-bit digital-to-analog converter. As shown in FIG. 1, the digital-to-analog converter 01 includes: a higher M−N-bit digital-to-analog conversion circuit 10, a voltage conversion circuit 20, an output circuit 30; wherein, M, N are both positive integers, and M>N.

It is to be noted that, in the present disclosure, specific values of M, N are not limited specifically, they are selected and set according to actual needs. According to some embodiments, it is possible to choose M=8, 9, 10, 11 or 12, N=2, 3 or 4; in order to further explain the M-bit digital-to-analog converter in the present disclosure clearly and simply, in the following embodiments, by taking M=10, N=3; i.e., M−N=7 as an example, the present disclosure is explained.

Specifically, with reference to FIG. 1, the higher 7 (M−N)-bit digital-to-analog conversion circuit 10 includes: a higher 7 (M−N)-bit voltage division generation circuit 101, a first voltage selection circuit 102; the first voltage selection circuit 101 selects a first voltage from the higher 7 (M−N)-bit voltage division generation circuit based on a higher 7 (M−N)-bit digital signal in a 10 (M)-bit digital signal, to be output from a first voltage end VL.

The voltage conversion circuit 20 includes a first switch circuit 201, a second switch circuit 202 and a capacitor circuit 203; the first switch circuit 201 is connected with the higher 7 (M−N)-bit voltage division generation circuit 101 and the capacitor circuit 203, the second switch circuit 202 is connected with the capacitor circuit 203, the first voltage end VL, a second voltage end VH; the voltage conversion circuit 20 is used to charge the capacitor circuit 203 under the control of the first switch circuit 201 and the second switch circuit 202, and discharge a second voltage to the second voltage end VH through the capacitor circuit 203 under the control of the first switch circuit 201 and the second switch circuit 202; wherein, a difference between the second voltage and the first voltage is equal to a step voltage $V_{LSB}$ in the higher 7 (M−N)-bit voltage division generation circuit 101.

The output circuit 30 is connected with the first voltage end VL and the second voltage end VH, controls output of the first voltage of the first voltage end VL and the second voltage of the second voltage end VH based on a lower 3 (N)-bit digital signal in the 10 (M)-bit digital signal, generates an analog voltage signal corresponding to the 10 (M)-bit digital signal, outputs the analog voltage signal through an output end Vout.

To sum up, with respect to the 10 (M)-bit digital-to-analog converter, the present inventor has known that generally it is necessary to adopt about 1024 ($2^M$) resistors, 2048 ($2^{M+1}$) switches, but when the technical solution in the present disclosure is adopted, adopting the higher 7 (M−N)-bit digital-to-analog conversion circuit as well as the voltage conversion circuit, the output circuit may achieve digitalto-analog conversion with an accuracy of 10 bits, wherein the higher 7 (M−N)-bit digital-to-analog conversion circuit adopted in the present disclosure is equivalent to one 7 (M−N)-bit digital-to-analog converter, it is only necessary to adopt about 128 ($2^{M-N}$) resistors, 256 ($2^{M-N+1}$) switches, and in this way, in comparison with to general implementations known by the present inventor, the design scheme in the present disclosure can greatly reduce the number of the used resistors and switches (reduce about $896=2^M-2^{M-N}$ resistors, $1792=2^{M+1}-2^{M-N+1}$ switches), thereby simplify the circuit structure of the digital-to-analog converter, and provide a possibility of reducing the IC size of the digital-to-analog converter.

Hereinafter, specific setting methods of the higher M−N-bit digital-to-analog conversion circuit 10, the voltage conversion circuit 20, the output circuit 30 are further explained.

Figure 2:
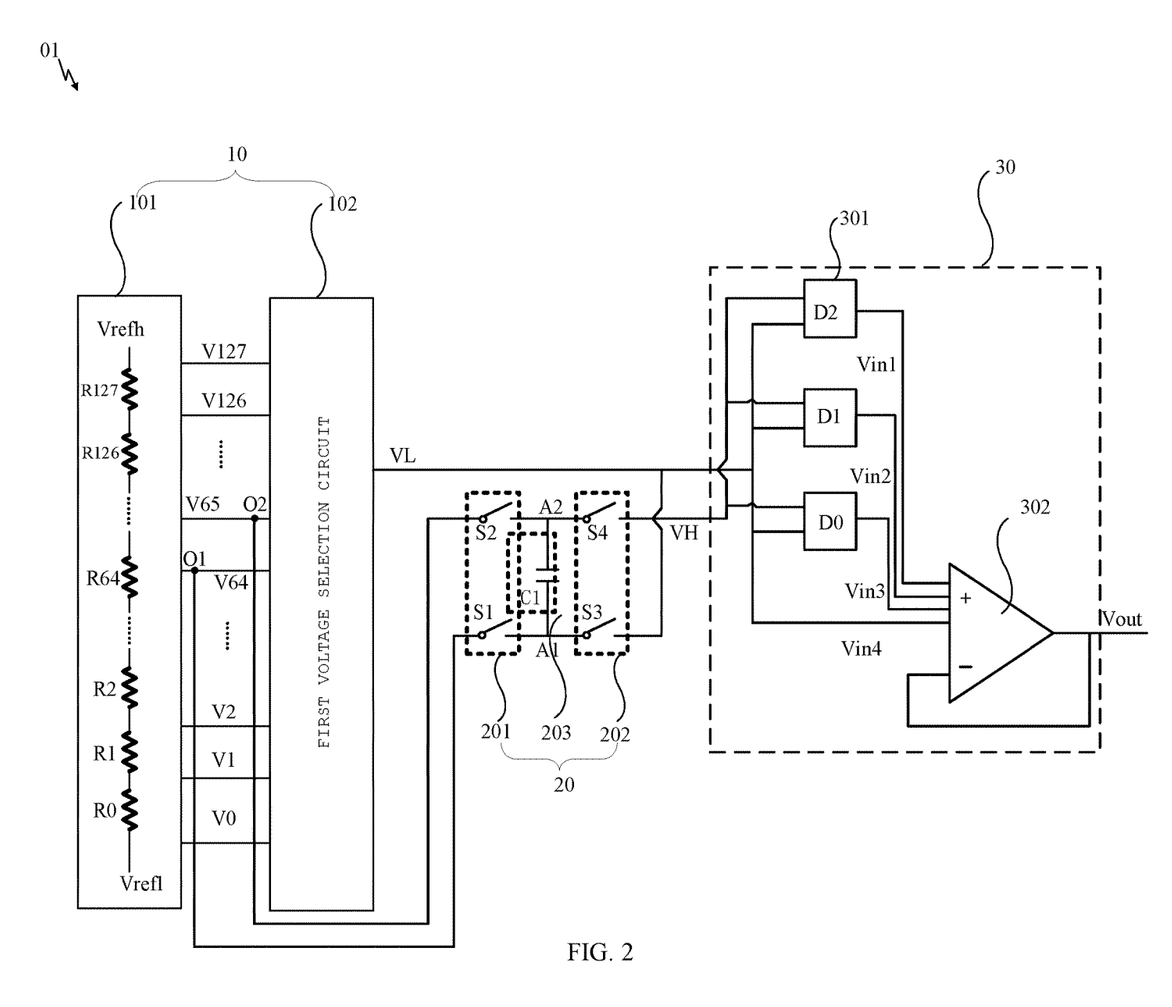
FIG. 2 is a schematic view of a structure of another digital-to-analog converter provided by an embodiment of the present disclosure.

Specifically, with respect to the higher M−N-bit digital-to-analog conversion circuit 10, as shown in FIG. 2, the higher M−N-bit voltage division generation circuit 101 in the higher M−N-bit digital-to-analog conversion circuit 10 includes: a series resistor element connected between a high potential voltage end Vrefh and a low potential voltage end Vrefl, the series resistor element includes $2^{M-N}$ resistors connected in series which have the same resistance value; schematically, as described in FIG. 2, the series resistor element in the higher 7-bit voltage division generation circuit includes $2^7=128$ resistors R0, R1, R2, R3 . . . R127 connected in series which have the same resistance value.

Of course, it should be understood that, with respect to the series resistor element which includes $2^{M-N}$ resistors with the same resistance value, it has $2^{M-N}+1$ different voltage nodes, there is one voltage node between any two adjacent resistors, the high potential voltage end Vrefh and the low potential voltage end Vrefl are respectively equivalent to one voltage node.

Figure 3:
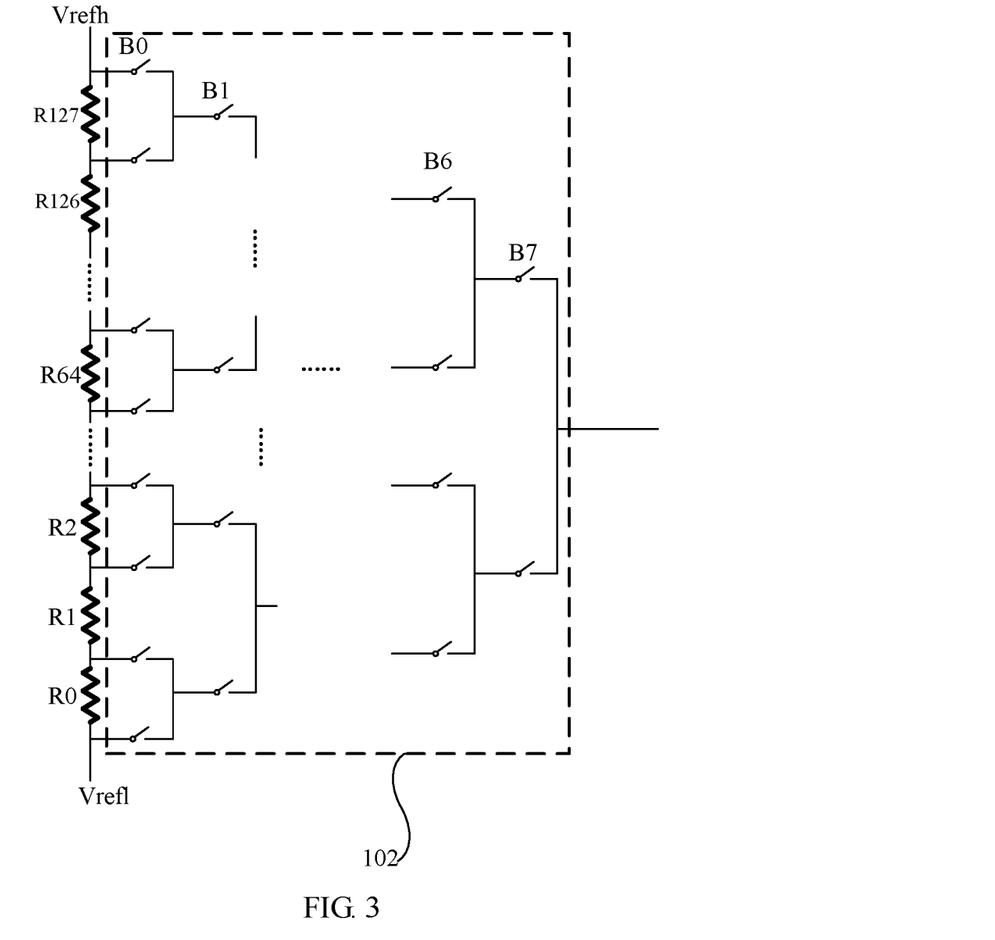
FIG. 3 is a schematic view of a structure of some components in a digital-to-analog converter provided by an embodiment of the present disclosure.

In addition, the present disclosure does not make limitations to specific setting cases of the first voltage selection circuit 102 in the higher M−N-bit digital-to-analog conversion circuit 10, and as shown in FIG. 3, it may be an M−N-bit binary switch tree (FIG. 3 schematically gives a schematic view of a structure of a 7-bit binary switch tree).

With respect to the voltage conversion circuit 20, as described before, the voltage conversion circuit 20 includes: the voltage conversion circuit 20 includes the first switch circuit 201, the second switch circuit 202 and the capacitor circuit 203; specifically, it is possible to refer to FIG. 2, the first switch circuit 201 includes a first switch S1 and a second switch S2; the capacitor circuit 203 includes a first capacitor C1; the second switch circuit 202 includes a third switch S3 and a fourth switch S4.

Wherein, a first end A1 of the first capacitor C1 is connected with a first node O1 in the series resistor element through the first switch S1, a second end A2 is connected with a second node O2 in the series resistor element through the second switch S2; wherein, the first node S1 and the second node S2 are voltage nodes of two adjacent ends of any one resistor in the series resistor element, and a voltage of the second node O2 is more than that of the first node O1, i.e., a difference between the voltage of the second node O2 and the voltage of the first node O1 is a step voltage $V_{LSB}$ in the series resistor element.

In addition, with reference to FIG. 2, the first end A1 of the first capacitor C1 is also connected with the first voltage end VL through the third switch S3, the second end A2 of the first capacitor C1 is also connected with the second voltage end VH through the fourth switch S4.

Figure 4:
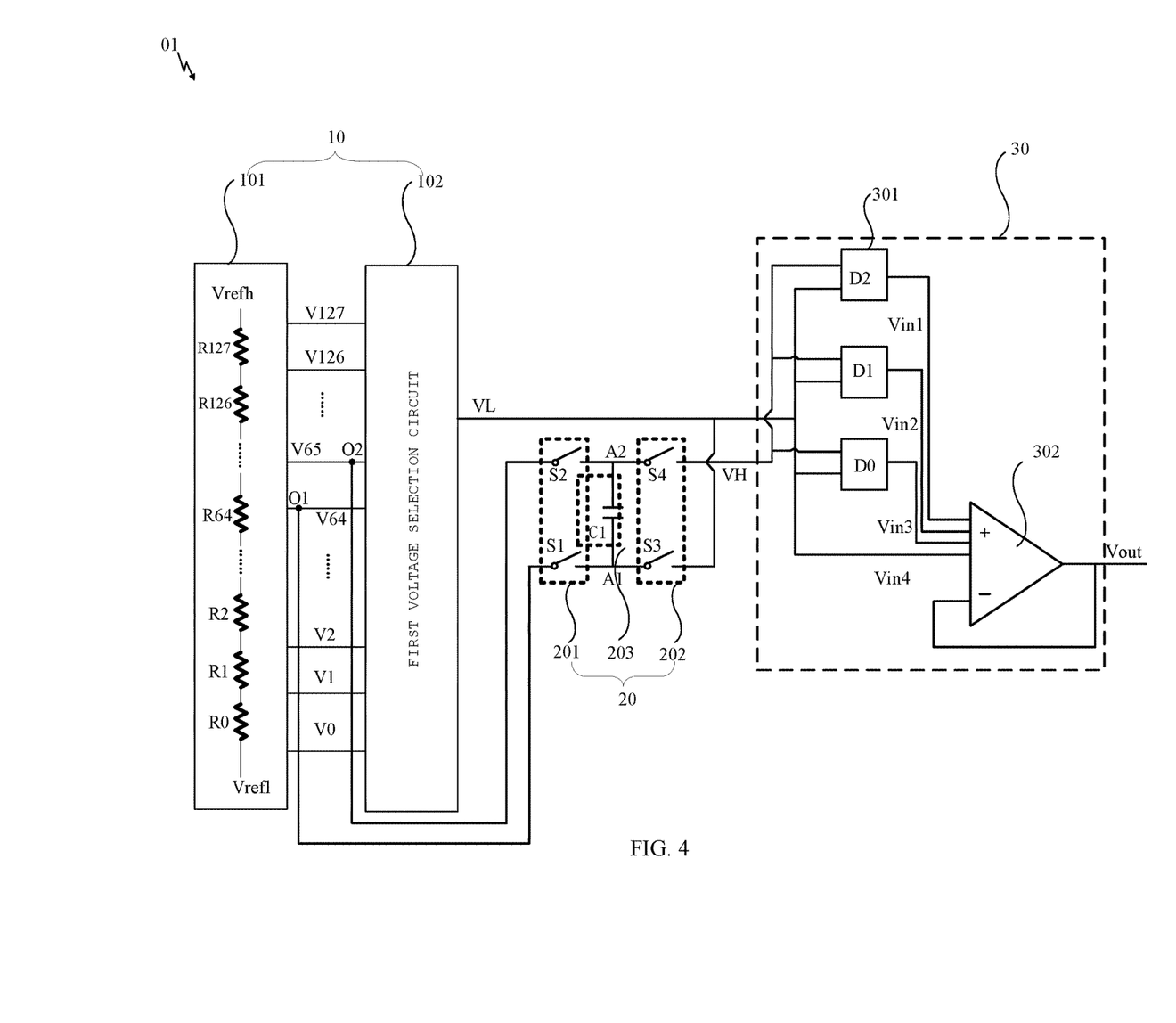
FIG. 4 is a schematic view of a structure of another digital-to-analog converter provided by an embodiment of the present disclosure.

On this basis, in order to guarantee stability of the entire voltage conversion circuit 20, reduce a spike voltage, cause the voltage of the above mentioned first capacitor C1 to be able to be output stably, as shown in FIG. 4, the voltage conversion circuit 20 may also include a second capacitor C2, a first end of the second capacitor C2 is grounded, a second end is connected between the first node O1 and the first switch S1; likewise, in some embodiments, the voltage conversion circuit may also include a third capacitor C3, a first end of the third capacitor C3 is grounded, a second end is connected between the third switch S3 and the first voltage end VL.

Here, it is to be noted that, the above mentioned first node S1 and second node S2 may be voltage nodes of two adjacent ends of any one resistor in the series resistor element; however, considering process errors in real manufacturing, it is necessary to reduce an error of the step voltage $V_{LSB}$ as much as possible, and according to some embodiments, adopt and choose voltage nodes of two adjacent ends of a resistor which is located in a middle of the series resistor element, and since the number of resistors between the middle of the series resistor element and the low potential voltage end Vrefl is approximately equal to the number of resistors between the middle of the series resistor element and the high potential voltage end Vrefh, it is possible to balance or offset a part of errors; for example, it is possible to choose voltage nodes of two ends of a $2^{N-1}$th or $2^{N-1}+1$th or $2^{N-1}-1$th resistor in the series resistor element in a direction from the low potential voltage end Vrefl to the high potential voltage end Vrefh; schematically, it is possible to refer to a voltage V64 of the first node O1 and a voltage V65 of the second node O2 of two ends of a 65 ($2^{7-1}+1$) resistor R64 in the series resistor element in the higher 7-bit voltage division generation circuit 101 in FIG. 2 or FIG. 4, of course, a difference between the voltage V65 of the second node O2 and the voltage V64 of the first node O1 (i.e. V65-V64) is the step voltage $V_{LSB}$ in the series resistor element.

Specifically, taking the voltage V64 of the first node O1 and the voltage V65 of the second node O2 shown in FIG. 4 as an example, hereinafter, a working process of the voltage conversion circuit 20 is further explained.

First, the first switch S1 and the second switch S2 in the first switch circuit 201 are closed, the third switch S3 and the fourth switch S4 in the second switch circuit 202 are opened, a voltage of the first end A1 of the first capacitor C1 is the voltage V64 of the first node O1, a voltage of the second end A2 is the voltage V65 of the second node O2, a difference between voltages of two ends of the first capacitor C1 is: V65-V64 (i.e., one step voltage $V_{LSB}$).

Then, the first switch S1 and the second switch S2 in the first switch circuit 201 are opened, the third switch S3 and the fourth switch S4 in the second switch circuit 202 are closed, at this time, the voltage of the first end A1 of the first capacitor C1 changes from V64 into the first voltage of the first voltage end VL (a change in the voltage thereof is VL-V64), and since charges on the first capacitor C1 can not jump, therefore, at this time, the voltage of the second end A2 of the first capacitor C1 will generate the same voltage change (VL-V64) on the basis of V65 to attain VL+V65-V64 (i.e., the second voltage), and the voltage VL+V65-V64 is output to the output circuit 30 through the second voltage end VH.

Of course, here, it should be understood that, a difference between the second voltage (VL+V65-V64) of the second voltage end VH and the first voltage of the first voltage end VL is V65-V64, is one step voltage $V_{LSB}$. In addition, it is to be noted that, in the present disclosure, for purposes of simplicity and clarity, VL which denotes the first voltage end is also used to denote the first voltage at some time, VH which denotes the second voltage end is also used to denote the second voltage at some time, which are not to be regarded as erroneous marks.

On this basis, with respect to the output circuit 30, as shown in FIG. 4, the output circuit 30 includes: 3 (N) second voltage selection circuits 301, as well as a buffer circuit 302 which has 4 (N+1) positive phase input ends, the 4 (N+1) input ends of the buffer circuit 302 are {Vin1, Vin2, Vin3, Vin4} respectively.

Specifically, with reference to FIG. 4, all of the N second voltage selection circuits 301 are connected with the first voltage end VL and the second voltage end VH of the voltage conversion circuit 30, and the N second voltage selection circuits 301 are connected with 3 (N) different positive phase input ends {Vin1, Vin2, Vin3} of the buffer circuit 302 respectively, are used to, according to the lower 3 (N)-bit digital signal in the 10 (M)-bit digital signal, select the first voltage of the first voltage end VL or the second voltage of the second voltage end VH to be output to corresponding positive phase input ends of the buffer circuit 302.

That is, through each second voltage selection circuit 301, the first voltage of the first voltage end VL or the second voltage of the second voltage end VH which is connected with it is selected to be output to corresponding positive phase input ends in the buffer circuit 302; specifically, it may be such a case where, when the second voltage selection circuit 301 receives a digital signal 0, it selects the first voltage of the first voltage end VL to be output to corresponding positive phase input ends in the buffer circuit; when the second voltage selection circuit 301 receives a digital signal 1, it selects the second voltage of the second voltage end VH to be output to corresponding positive phase input ends in the buffer circuit.

In addition, as shown in FIG. 4, a positive phase input end Vin(N+1) of the buffer circuit 302 is connected with the first voltage end VL, a negative phase input end of the buffer circuit 302 is connected with the output end (which is the output end Vout of the digital-to-analog converter); and values of width to length ratios (W/L) of differential pair tubes of N+1 branches corresponding to positive phase input ends {Vin1, Vin2 . . . Vin(N+1)} of the buffer circuit 302 are $(2^{N-1}:2^{N-2} \ldots 2^1:2^0:1)$, schematically, with reference to FIG. 4 (N=3), values of width to length ratios (W/L) of differential pair tubes of 4 branches corresponding to positive phase input ends {Vin1, Vin2, Vin3, Vin4} of the buffer circuit 302 are 4:2:1:1.

Here, it is to be noted that, in real manufacturing, the above mentioned second voltage selection circuit 301 may be a CMOS transmission gate switch, and by controlling the CMOS transmission gate switch, it is possible to select to output the first voltage of the first voltage end VL or the second voltage of the second voltage end VH to corresponding positive phase input ends in the buffer circuit 302; the output circuit 30 may be a multi-input buffer; but the present disclosure is not limited thereto.

Hereinafter, a working process of the output circuit 30 is further explained.

With reference to the 10-bit digital-to-analog converter including the higher 7-bit digital-to-analog conversion circuit and the lower 3-bit output circuit 30 shown in FIG. 4, in conjunction with the next table:

| D1D2D0 | Vin1 (D1) 4 | Vin2 (D2) 2 | Vin3 (D3) 1 | Vin4 1 | Vout |
|---|---|---|---|---|---|
| 000 | VL | VL | VL | VL | VL |
| 001 | VL | VL | VH | VL | 7/8 VL + 1/8 VH |
| 010 | VL | VH | VL | VL | 6/8 VL + 2/8 VH |
| 011 | VL | VH | VH | VL | 5/8 VL + 3/8 VH |
| 100 | VH | VL | VL | VL | 4/8 VL + 4/8 VH |
| 101 | VH | VL | VH | VL | 3/8 VL + 5/8 VH |
| 110 | VH | VH | VL | VL | 2/8 VL + 6/8 VH |
| 111 | VH | VH | VH | VL | 1/8 VL + 7/8 VH | in the above table, D2D1D0 corresponds to the lower 3-bit digital signal in the 10-bit digital signal, and with reference to the above table, wherein "0" means that the first voltage VL is output to corresponding positive phase input ends in the buffer circuit 302 through the second voltage selection circuit 301, "1" means that the second voltage VH is output to corresponding positive phase input ends in the buffer circuit 302 through the second voltage selection circuit 301, and in conjunction with the above table and FIG. 4, the above mentioned D2 corresponds to the input end Vin1, D1 corresponds to the input end Vin2, D0 corresponds to the input end Vin3, the first voltage VL is directly input to the input end Vin4; values of width to length ratios (W/L) of differential pair tubes of 4 branches corresponding to positive phase input ends {Vin1, Vin2, Vin3, Vin4} are 4:2:1:1.

In conjunction with the aforementioned content, it may be known that, through the higher 7-bit digital-to-analog conversion circuit, any higher 7-bit digital signal (1111111* * * ~0000000 * * *) in the 10-bit digital signal may be output, the higher 7-bit digital signal corresponds to 128 different analog voltage signals; with respect to the lower 3-bit digital signal (* * *) in the 10-bit digital signal, corresponding 000~111 in the above table may be referred to.

It should be understood that, the second voltage VH is the sum of the first voltage VL and the step voltage $V_{LSB}$, and according to the design method in which values of width to length ratios (W/L) of differential pair tubes of 4 branches in the buffer circuit are 4:2:1:1, the step voltage can be distributed in a corresponding ratio, thereby achieve the digital-to-analog conversion with an accuracy of $V_{LSB}/(4+2+1+1)$; for example, in a case where the step voltage $V_{LSB}$=1 v, the adjustment accuracy of the digital-to-analog converter is 0.125 v.

Schematically, with reference to FIG. 4, an example is taken in which the low potential voltage end Vrefl is 0 v, the high potential voltage end Vrefh is 127 v, the series resistor element includes 127 resistors, each of which has a resistance value of 1Ω, connected in series; it should be understood that, at this time, the step voltage $V_{LSB}$ in the higher 7-bit voltage division generation circuit is 1 v (V65-V64=1 v); the adjustment accuracy of the digital-to-analog converter is 0.125 v; in this case, with respect to the 10-bit digital signal, it is possible to acquire different analog voltages of 0, 1 v, 2 v . . . 127 v through the higher 7-bit digital-to-analog conversion circuit; and acquire analog voltages corresponding to the 10-bit digital signal through the lower 3-bit output circuit.

Specifically, taking the 10-bit digital signal being 1111111001 (which is equal to 1107 in a decimal system) as an example, through the higher 7-bit digital-to-analog conversion circuit, the first voltage VL corresponding to the higher 7-bit digital signal 1111111 is acquired as V127=127 v; at this time, the second voltage VH is 128 v (i.e., 127+1=128); in this case, the adjustment accuracy of the digital-to-analog converter is 0.125 v; in conjunction with a case of a digital signal in which the lower 3-bit is 001 in the above table, the output voltage Vout=7/8VL+1/8VH=7/8× 127+1/8×128=127.125; it may be seen that: the numerical value is equal to the product (1017×0.125) of the decimal number (1017) of the 10-bit digital signal 1111111001 and the adjustment accuracy (0.125), i.e., the digital-to-analog converter in the present disclosure may normally and accurately output the 10-bit digital signal; of course, in fact, it is possible to select setting of an appropriate adjustment accuracy according to needs, only illustrative explanation is given here, the present disclosure does not make specific limitations thereto, e.g. the adjustment accuracy may be an arbitrary value such as 1, 2, 3, etc.

Figure 5:
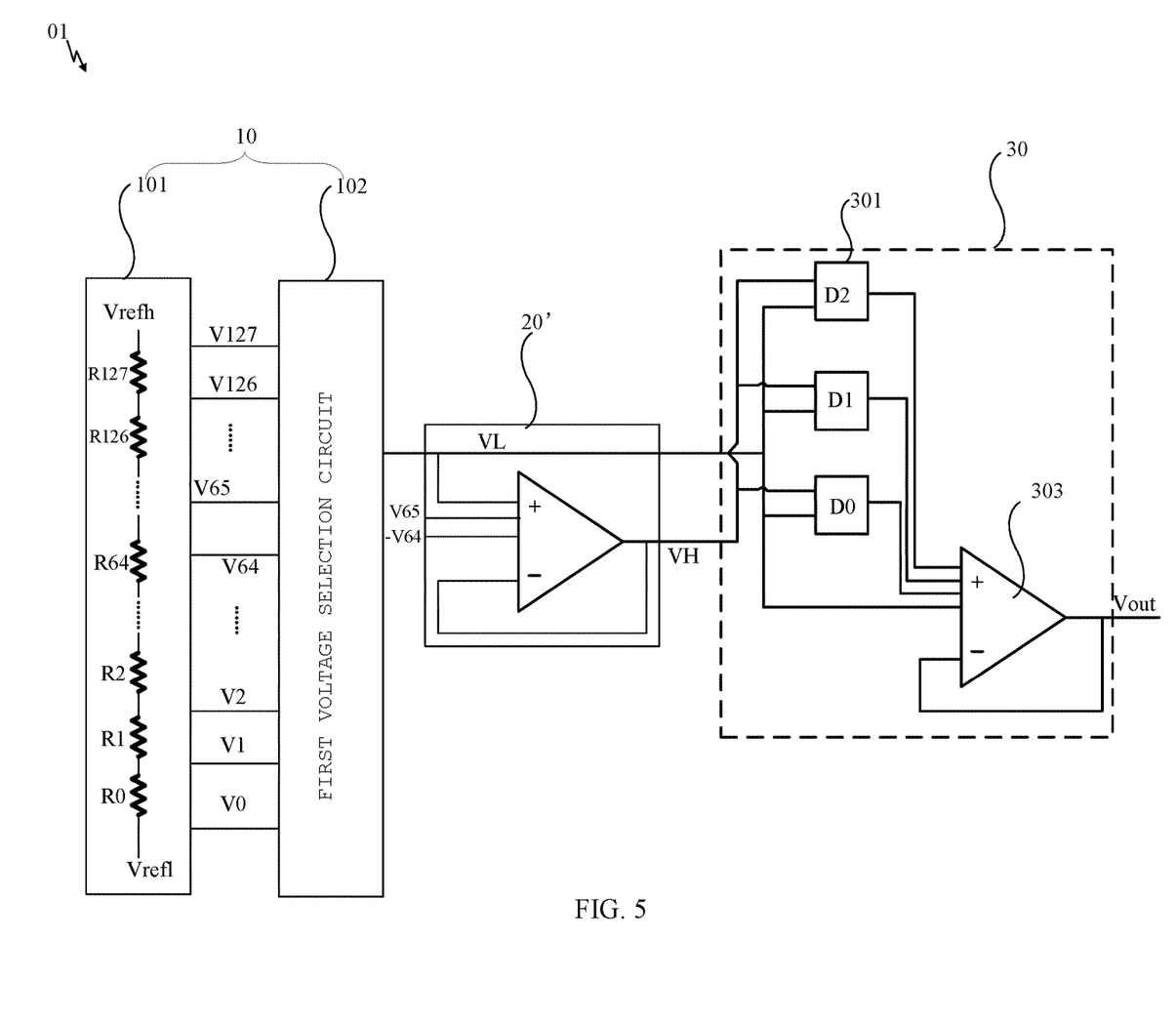
FIG. 5 is a schematic view of a structure of another digital-to-analog converter provided by an embodiment of the present disclosure.

In addition, it is also to be noted that, when the present inventor of the present application designs the above mentioned digital-to-analog converter, he/she also designs a digital-to-analog converter as shown in FIG. 5, the digital-to-analog converter differs from the aforementioned digital-to-analog converter shown in FIG. 4 (or FIG. 2) only in the voltage conversion circuit, the voltage conversion circuit 20' in FIG. 5 adopts a form of an operational amplifier to acquire the second voltage VH, whereas the voltage conversion circuit 20 in FIG. 4 (or FIG. 2) adopts the capacitor with the control of the switches to acquire the second voltage VH.

In comparison with general digital-to-analog converters known by the present inventor, both of them can greatly reduce the number of the used resistors and switches, thereby simplify the circuit structure of the digital-to-analog converter, reduce the IC size of the digital-to-analog converter; but by comparing the two digital-to-analog converters in FIG. 5 and FIG. 4, it should be understood that, the voltage conversion circuit 20' of the digital-to-analog converter in FIG. 5 adopts a design scheme of the operational amplifier, and in comparison with to the scheme in which the voltage conversion circuit 20 of the digital-to-analog converter in FIG. 4 adopts the capacitor in cooperation with the switches, since the operational amplifier occupies a relatively large area, adopting the design of the capacitor in cooperation with the switches may further simplify the circuit structure of the digital-to-analog converter, and can further reduce the IC size of the digital-to-analog converter.

An embodiment of the present disclosure further provides a conversion circuit, which includes the aforementioned digital-to-analog converters and has the same structures and advantageous effects as the digital-to-analog converters provided by the aforementioned embodiments. Since the aforementioned embodiments have already described the structures and advantageous effects of the digital-to-analog converters in detail, description thereof is no longer repeated herein.

It is to be noted that, in an embodiment of the present disclosure, specific application fields of the conversion circuit are not limited, and in fact, it is possible to select corresponding application fields according to needs; for example, it may be applied to a display device, especially a big-size AMOLED (Active Matrix Organic Light Emitting Diode) display device, each column drive circuit of Source Drive IC thereof the drive circuit has hundreds of even thousands of digital-to-analog converters; of course there may also be other application fields.

Figure 6:
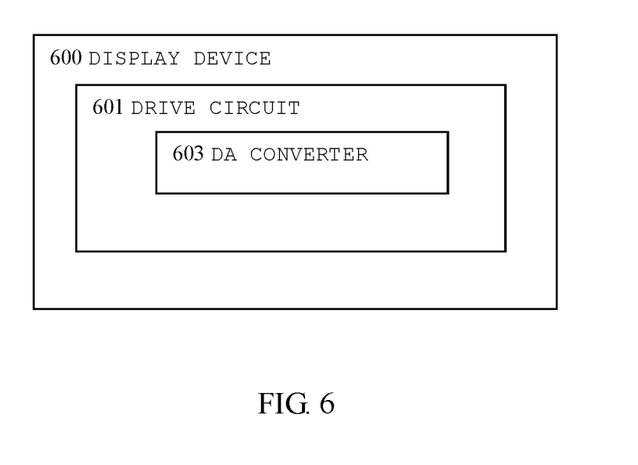
FIG. 6 is a schematic view of a structure of a display device provided by an embodiment of the present disclosure.

According to some embodiments of the present disclosure, there is provided a display device, which includes the conversion circuit as described above. As shown in FIG. 6, a display device 600 according to an embodiment of the present disclosure is illustrated, which includes a conversion circuit 601 as described above, the conversion circuit 601 includes the digital-to-analog converter as described above.

The display device 600 may be any product or component, such as electronic paper, an OLED panel, a cellphone, a tablet computer, a TV set, a display, a notebook computer, a digital photo frame, a navigator, which has a display function.

The above are only specific embodiments of the present disclosure, but the protection scope of the present disclosure is not limited thereto. Any changes or substitutions which may be easily conceived of by those skilled in the art within the technical scope disclosed by the present disclosure are to be covered within the protection scope of the present disclosure. Therefore, the protection scope of the present disclosure is based on the protection scope of the claims.

What is claimed is:

1. A digital-to-analog converter, wherein the digital-to-analog converter is an M-bit digital-to-analog converter the digital-to-analog converter includes: a higher M-N-bit digital-to-analog conversion circuit, a voltage conversion circuit, an output circuit, wherein M and N are both positive integers, and M>N;

the higher M-N-bit digital-to-analog conversion circuit includes: a higher M-N-bit voltage division generation circuit, a first voltage selection circuit, the first voltage selection circuit selects a first voltage from the higher M-N-bit voltage division generation circuit based on a higher M-N-bit digital signal in an M-bit digital signal, to be output from a first voltage end;

the voltage conversion circuit includes: a first switch circuit, a second switch circuit and a capacitor circuit the first switch circuit is connected with the higher M-N-bit voltage division generation circuit and the capacitor circuit, the second switch circuit is connected with the capacitor circuit, the first voltage end, and a second voltage end, wherein the voltage conversion circuit is used to charge the capacitor circuit under control of the first switch circuit and the second switch circuit, and discharge a second voltage to the second voltage end through the capacitor circuit under the control of the first switch circuit, and the second switch circuit, and wherein a difference between the second voltage and the first voltage is equal to a step voltage in the higher M-N-bit voltage division generation circuit;

the output circuit is connected with the first voltage end and the second voltage end, controls output of the first voltage of the first voltage end and the second voltage of the second voltage end based on a lower N-bit digital signal in the M-bit digital signal, and generates and outputs an analog voltage signal corresponding to the M-bit digital signal, wherein the first switch circuit includes a first switch and a second switch, and the capacitor circuit includes a first capacitor, a first end of the first capacitor is connected with a first node in the series resistor element through the first switch, a second end is connected with a second node in the series resistor element through the second switch, wherein the first node and the second node are voltage nodes of two adjacent ends of any one resistor in the series resistor element, and a voltage of the second node is more than that of the first node, and wherein the second switch circuit includes a third switch and a fourth switch, the first end of the first capacitor is also connected with the first voltage end through the third switch, and the second end of the first capacitor is also connected with the second voltage end through the fourth switch.

2. The digital-to-analog converter according to claim 1, wherein the higher M-N-bit voltage division generation circuit includes a series resistor element connected between a high potential voltage end and a low potential voltage end, the series resistor element includes $2^{M-N}$ resistors connected in series which have a same resistance value.

3. The digital-to-analog converter according to claim 1, wherein the voltage conversion circuit further includes at least one of:
   a second capacitor, a first end of the second capacitor being grounded, a second end being connected between the first node and the first switch; and
   a third capacitor, a first end of the third capacitor being grounded, a second end being connected between the third switch and the first voltage end.

4. The digital-to-analog converter according to claim 1, wherein the first node and the second node are voltage nodes of two ends of a $2^{N-1}$th or $2^{N-1}+1$th or $2^{N-1}-1$th resistor in the series resistor element in a direction from the low potential voltage end to the high potential voltage end.

5. The digital-to-analog converter according to claim 1, wherein the output circuit includes: a buffer circuit which has N+1 positive phase input ends as well as N second voltage selection circuits;
   the N+1 input ends of the buffer circuit are {Vin1, Vin2 Vin(N+1)} respectively;
   all of the N second voltage selection circuits are connected with the first voltage end and the second voltage end, and the N second voltage selection circuits are connected with the N different positive phase input ends {Vin1, Vin2 VinN} of the buffer circuit respectively, are used to, according to the lower N-bit digital signal in the M-bit digital signal, select the first voltage of the first voltage end or the second voltage of the second voltage end to be output to corresponding positive phase input ends in the buffer circuit;
   a positive phase input end Vin(N+1) of the buffer circuit is connected with the first voltage end, a negative phase input end of the buffer circuit is connected with an output end; and
   values of width to length ratios of differential pair tubes of N+1 branches corresponding to positive phase input ends {Vin1, Vin2 Vin(N+1)} of the buffer circuit are $2^{N-1}:2^{N-2} \ldots 2^1:2^0:1$.

6. The digital-to-analog converter according to claim 1, wherein the first voltage selection circuit is an M-N-bit binary switch tree.

7. The digital-to-analog converter according to claim 1, wherein M=8, 9, 10, 11 or 12.

8. The digital-to-analog converter according to claim 1, wherein N=2, 3 or 4.

9. A conversion circuit comprising the digital-to-analog converter according to claim 1.

10. A display device comprising the conversion circuit according to claim 9.

11. The conversion circuit of claim 9, wherein the higher M-N-bit voltage division generation circuit includes a series resistor element connected between a high potential voltage end and a low potential voltage end, the series resistor element includes $2^{M-N}$ resistors connected in series which have a same resistance value.

12. The display device of claim 10, wherein the higher M-N-bit voltage division generation circuit includes a series resistor element connected between a high potential voltage end and a low potential voltage end, the series resistor element includes $2^{M-N}$ resistors connected in series which have a same resistance value.

13. The conversion circuit of claim 9, wherein the voltage conversion circuit further includes at least one of:
   a second capacitor, a first end of the second capacitor being grounded, a second end being connected between the first node and the first switch; and
   a third capacitor, a first end of the third capacitor being grounded, a second end being connected between the third switch and the first voltage end.

14. The conversion circuit of claim 9, wherein the first node and the second node are voltage nodes of two ends of a $2^{N-1}$th or $2^{N-1}+1$th or $2^{N-1}-1$th resistor in the series resistor element in a direction from the low potential voltage end to the high potential voltage end.

15. The conversion circuit of claim 9, wherein the output circuit includes: a buffer circuit which has N+1 positive phase input ends as well as N second voltage selection circuits;
   the N+1 input ends of the buffer circuit are {Vin1, Vin2 Vin(N+1)} respectively;
   all of the N second voltage selection circuits are connected with the first voltage end and the second voltage end, and the N second voltage selection circuits are connected with the N different positive phase input ends {Vin1, Vin2 VinN} of the buffer circuit respectively, are used to, according to the lower N-bit digital signal in the M-bit digital signal, select the first voltage of the first voltage end or the second voltage of the second voltage end to be output to corresponding positive phase input ends in the buffer circuit;
   a positive phase input end Vin(N+1) of the buffer circuit is connected with the first voltage end, a negative phase input end of the buffer circuit is connected with an output end; and
   values of width to length ratios of differential pair tubes of N+1 branches corresponding to positive phase input ends {Vin1, Vin2 Vin(N+1)} of the buffer circuit are $2^{N-1}:2^{N-2} \ldots 2^1:2^0:1$.

16. The conversion circuit of claim 9, wherein the first voltage selection circuit is an M-N-bit binary switch tree.

17. The conversion circuit of claim 9, wherein M=8, 9, 10, 11 or 12.

18. The conversion circuit of claim 9, wherein N=2, 3 or 4.

* * * * *

UNITED STATES PATENT AND TRADEMARK OFFICE
CERTIFICATE OF CORRECTION

PATENT NO.        : 11,025,266 B2                                          Page 1 of 1
APPLICATION NO.   : 16/489150
DATED             : June 1, 2021
INVENTOR(S)       : Tangxiang Wang et al.

It is certified that error appears in the above-identified patent and that said Letters Patent is hereby corrected as shown below:

In the Claims

Column 10, Line 18, Claim 1, delete "converter" and insert -- converter, --

Column 10, Line 31, Claim 1, delete "circuit" and insert -- circuit, --

Column 10, Line 41, Claim 1, delete "circuit," and insert -- circuit --

Column 11, Lines 27-28, Claim 5, delete "Vin2 Vin(N+1)}" and insert -- Vin2......Vin(N+1)} --

Column 11, Line 33, Claim 5, delete "Vin2 VinN}" and insert -- Vin2......VinN} --

Column 11, Line 45, Claim 5, delete "Vin2 Vin(N+1)}" and insert -- Vin2......Vin(N+1)} --

Column 12, Lines 31-32, Claim 15, delete "Vin2 Vin(N+1)}" and insert -- Vin2......Vin(N+1)} --

Column 12, Line 37, Claim 15, delete "Vin2 VinN}" and insert -- Vin2......VinN} --

Column 12, Line 49, Claim 15, delete "Vin2 Vin(N+1)}" and insert -- Vin2......Vin(N+1)} --

Signed and Sealed this
Seventeenth Day of August, 2021

Drew Hirshfeld
*Performing the Functions and Duties of the*
*Under Secretary of Commerce for Intellectual Property and*
*Director of the United States Patent and Trademark Office*